United States Patent [19]

Kuwabara et al.

[11] Patent Number: 4,967,399
[45] Date of Patent: Oct. 30, 1990

[54] ERASABLE AND PROGRAMMABLE READ-ONLY MEMORY SYSTEM

[75] Inventors: Hiroshi Kuwabara; Shooji Kitazawa, both of Tokyo, Japan

[73] Assignee: OKI Electric Industry Co., Ltd, Tokyo, Japan

[21] Appl. No.: 225,375

[22] Filed: Jul. 28, 1988

[30] Foreign Application Priority Data

Aug. 3, 1987 [JP] Japan ................................. 62-194258

[51] Int. Cl.$^5$ ............................................... G11C 8/00
[52] U.S. Cl. ........................... 365/230.06; 365/189.11; 307/463
[58] Field of Search .................... 365/230.06, 203, 185, 365/194, 189.11; 307/482, 570, 463

[56] References Cited

U.S. PATENT DOCUMENTS

| | | | |
|---|---|---|---|
| 4,455,629 | 6/1984 | Suzuki et al. | 365/230.06 |
| 4,622,479 | 11/1986 | Taylor | 307/482 |
| 4,704,706 | 11/1987 | Nakano et al. | 307/482 X |
| 4,806,798 | 2/1989 | Kanauchi | 307/482 X |
| 4,814,647 | 3/1989 | Tran | 307/482 |

FOREIGN PATENT DOCUMENTS 246098 12/1985 Japan .

OTHER PUBLICATIONS

"Nonvolatile Memories" 1984 IEEE International Solid-State Circuits Conference, Feb. 23rd, 1984, pp. 136–137.

Primary Examiner—Stuart N. Hecker
Assistant Examiner—Andrew L. Sniezek

[57] ABSTRACT

Am EPROM system comprising a memory cell array formed of a matrix of non-volatile semiconductor memory cells, each having a control gate and a floating gate, and storing electric charges on the floating gate, and a word line drive circuit driving respective word lines connected to the control gates of the respective memory cells. The word line drive circuit comprises a delay circuit for delaying a first selection signal, a boosting capacitor having a first electrode connected to the first selection signal and a second electrode connected the output of the delay circuit, and MOS transistors each having a gate electrode connected the second electrode of the boosting capacitor, a first electrode connected to receive a second selection signal and a second electrode connected to a word line.

8 Claims, 8 Drawing Sheets

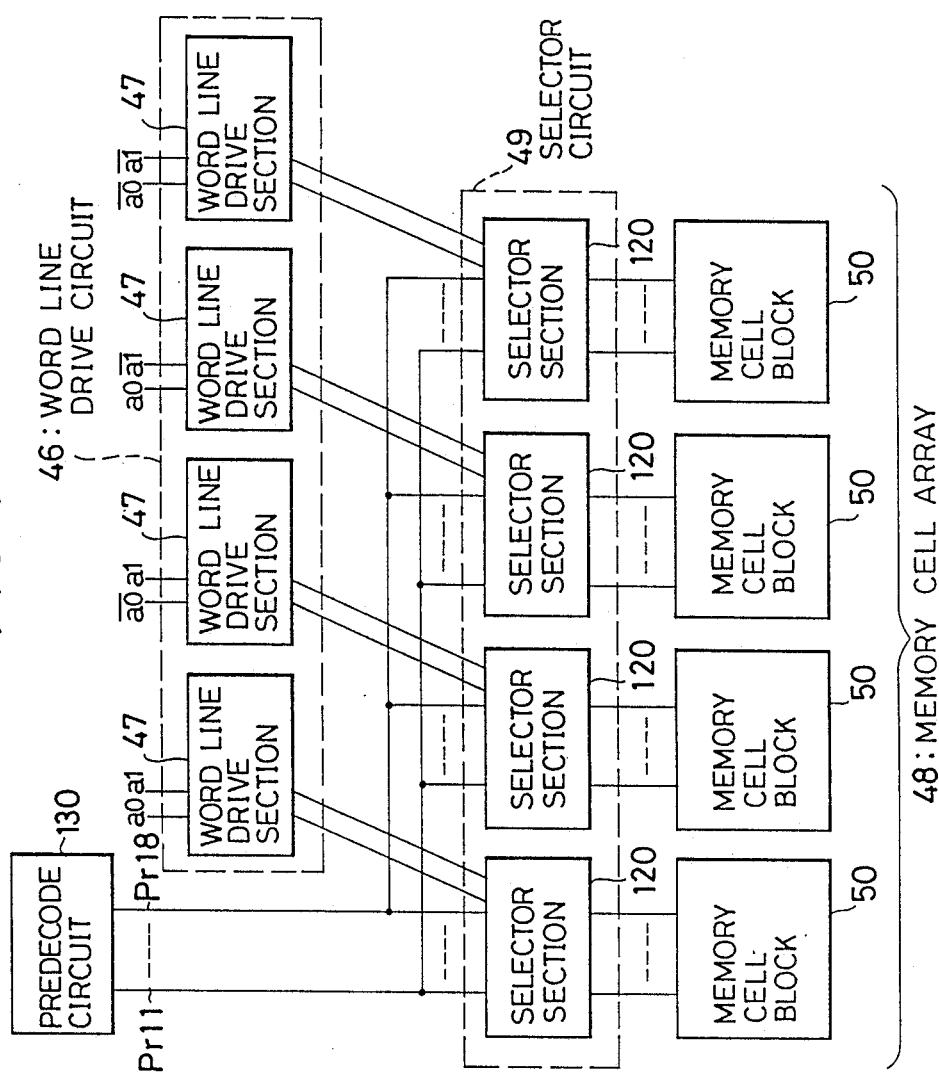

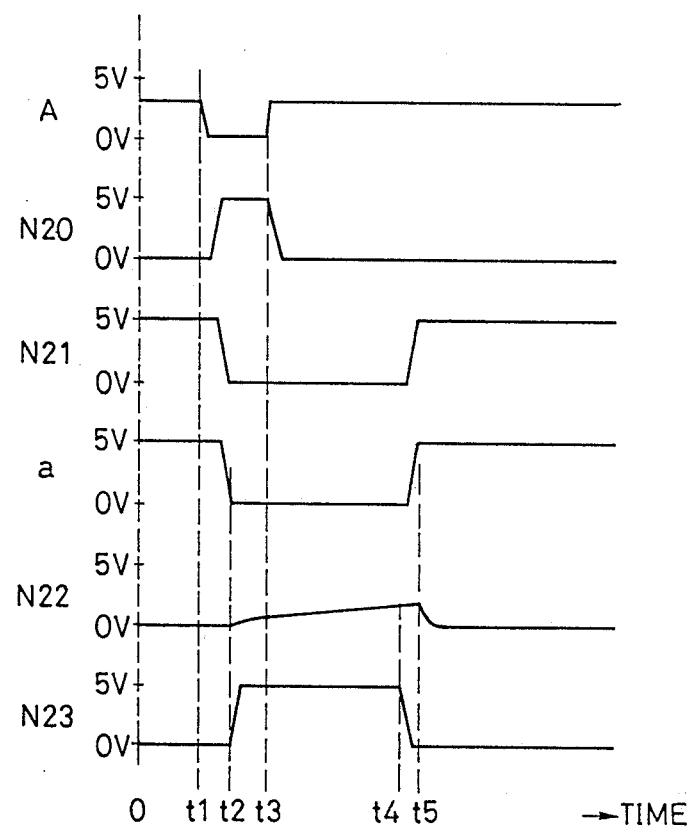

ERASABLE AND PROGRAMMABLE READ-ONLY MEMORY SYSTEM

BACKGROUND OF THE INVENTION

The present invention relates to an EPROM (erasable programmable read-only memory) having memory cells formed of semiconductor devices such as MOSFET (insulated gate field effect transistor) or FAMOS (floating gate avalanche injection MOSFET), and particularly its word line drive circuits.

An example of EPROM is shown in Japanese Patent Application Laid-open No. 246098/1985, which will next be described with reference to FIG. 1.

In FIG. 1, part of a memory cell array in a conventional EPROM is shown. For the purpose of simplicity, the memory cell array is shown to comprises 2×2 memory cells.

The memory cells 1-1 to 1-4 are formed of semiconductor devices such as FAMOS. The control gates of the memory cells 1-1 and 1-2 which are aligned in the horizontal directions are connected together to a word line 2-1. Similarly, the control gates of the memory cells 1-3 and 1-4 which are aligned in the horizontal direction are connected together to a word line 2-2. The drains of the memory cells 1-1 and 1-3 which are aligned in the vertical direction are connected together to a bit line 3-1. Similarly, the drains of the memory cells 1-2 and 1-4 which are aligned in the vertical direction are connected together to a bit line 3-2.

The sources of the memory cells 1-1 to 1-4 are connected to the ground (=0 V).

First, the writing operation that is, writing in the memory cells 1-1 to 1-4 will be explained.

Assume that the memory cell 1-1 is to be selected. A relatively high voltage (e.g., 12.5 V) is applied to the selected word line 2-1, while 0 V is applied to the unselected word line 2-2. Moreover, a relatively high voltage (e.g., 9 V) is applied to the selected bit line 3-1 while the unselected bit line 3-2 is brought to the open state. In the selected memory cell 1-1, because of the high control gate voltage, a large amount of channel current is created. The channel current is accelerated by the high electric field between the drain and the source, and generates hot electrons with a high energy. The hot electrons are injected into the floating gate, exceeding the energy barrier of the gate oxide film. Injection of the hot electrons into the floating gate means that "information has been written". The threshold of the memory cell 1-1 in which the information has been written will become higher (e.g.,7 V) than the voltage (e.g., 5 V) of the selected word line 2-1 during reading. The threshold of the memory cells 1-2 to 1-4 in which information has not been written is low (e.g., 2 V). Thus, whether the threshold is high or low indicate the information "0" or "1" is stored.

The operation during reading will now be described.

When for instance the memory cell 1-1 is selected, 5 V is applied to the selected word line 2-1 and 0 V is applied to the unselected word line 2-2. A relatively low voltage is applied to the selected bit line 3-1 in order to prevent generation of hot electrons due to a high electric field between the drain and source, which can cause an erroneous writing operation. The unselected bit line 3-2 is made in an open state. If the selected memory cell 1-1 is an unwritten memory cell (in which "1" is stored), the threshold is 2 V and since 5 V is being applied to the control gate, the memory cell 1-1 becomes on and a current flows through the drain and source. This current is detected by a sense amplifier not, shown, and amplified, and output to an output terminal of the EPROM as a high level (H-level) signal. If the selected memory cell is a written memory cell (in which "0" is stored), the threshold is 7 V, and since 5 V is being applied to the control electrode the memory cell 1-1 is off and no current flows through the drain and source. This fact that no current flows is detected by the sense amplifier and amplified and output to the output terminal of the EPROM as a low level (L-level) signal.

If the threshold of the memory cell that has not been written ("1" is stored) is denoted by Vthm and if the voltage of the selected word line is denoted by Vwl, the drain current of the unwritten memory cell is proportional to (Vwl−Vthm) when the memory cell is operating in the triode region, and is proportional to (Vwl−Vthm)$^2$ when the memory cell is operating in the pentode region. As was described earlier, the sense amplifier detects the current flowing through the memory cell. In order to quickly read the unwritten memory cell the sense amplifier must operate quickly, and for this the current flowing through the memory cell must be increased. Accordingly, a word line drive circuit for quickly driving the control gate of the memory cell, i.e., the selected word line to the voltage of the power supply is required.

FIG. 2 shows a word line drive circuit of the conventional EPROM described in the above-mentioned publication. FIG. 3 shows a predecoder circuit incorporated in the word line drive circuit. The word line drive circuit shown in FIG. 2 comprises a decoder circuit 10 for decoding the internal address signals a1 to a3 and selecting the word lines 2-1 to 2-8, and voltage booster circuit 20 connected to the output node N3 of the decoder circuit 10, and pairs of N-channel MOS (NMOS) transistors 30-1 to 30-8 and 31-1 to 31-8.

The decoder circuit 10 comprises depletion-type NMOS transistors 11, 16, enhancement-type NMOS transistors 12 to 14, 17 to 19, and intrinsic-type NMOS transistor 15 whose threshold is 0 V. The internal address signals a-1 to a-3 supplied to the gates of the NMOS transistors 12 to 14 are in phase with the external address signals supplied to an address buffer, not shown. The address buffer also generates internal address signals opposite in phase. Vcc denotes the power supply voltage, ovs/PD/ denotes a signal input to the gate of the NMOS transistor 15 and is at the high level during operation and at the low level during stand-by to reduce power consumption. N1 denotes a node connected to the gate of the NMOS transistor 17 and N2 denotes a node connected to the gate of the NMOS transistor 19.

The booster circuit 20 gradually boosts the voltage of the node N3 when the node N3 is raised to the high level responsive to the input of the internal address signals a-1 to a-3. The booster circuit 20 comprises a depletion-type NMOS transistor 21, intrinsic-type NMOS transistors 22 and 23, a capacitor 24 and a terminal receiving an oscillating signal OC. Pairs of NMOS transistors 30-1 to 30-8 and 31-1 to 31-8 are enhancement-type transistors. Connected to the junctions of the transistors, e.g., 30-1 and 31-1, of the respective pairs are word lines 2-1 to 2-8. Supplied to the gates of the NMOS transistors 30-1 to 30-8 and 31-1 to 31-8 are complementary predecode signals $\overline{Pr1}$ to Pr8 and $\overline{Pr1}$ to Pr8, which are generated by the predecode circuit in FIG. 3.

The predecode circuit shown in FIG. 3 comprises AND gates 40-1 to 40-8 and inverters 41-1 to 41-8. Supplied to the respective AND gates 40-1 to 40-8 are complementary internal address signals a4, a5, a6; a4, a5, $\bar{a}6$; a4, $\bar{a}5$, a6; a4, $\bar{a}5$, $\bar{a}6$; $\bar{a}4$, a5, a6; $\bar{a}4$, a5, $\bar{a}6$; $\bar{a}4$, $\bar{a}5$, a6; $\bar{a}4$, $\bar{a}5$, $\bar{a}6$. The AND gates 40-1 to 40-8 output the predecode signals Pr1 to Pr8, and inverted predecode signals $\overline{Pr1}$ to $\overline{Pr8}$ are output from the inverters 41-1 to 41-8. For instance, when the internal address signals a4, a5 and a6 are all at the high level, the predecode signal Pr1 at the output of the AND gate 40-1 is at the high level, while other predecode signals Pr2 to Pr8 are all at the low level.

Operation for driving the word line that is selected during reading will now be described with reference to FIG. 2.

Assume for instance that the word line 2-1 is to be selected. The internal address signals a1, a2 and a3 input to the respective gates of the NMOS transistors 12, 13 and 14 shown in FIG. 2 are all set at the low level, and the internal address signals a4, a5 and a6 input to the AND gates 40-1 to 40-8 are all set at the high level. Then, the NMOS transistors 12 to 14 are turned off and the node N1 is raised to the high level, and the node N2 thereby falls to the low level and the node N3 is raised to the high level. Because the internal address signals a4, a5 and a6 are all high, the predecode signal Pr1 at the output of the AND gate 40-1 is high, and the inverted predecode signal $\overline{Pr1}$ is low. The other predecode signals Pr2 to Pr8 become low and the inverted predecode signals $\overline{Pr2}$ to $\overline{Pr8}$ become high. As a result, the NMOS transistor 30-1 is turned on and the NMOS transistor 31-1 is turned off, so that the word line 2-1 is driven to the high level, while the other word lines 2-2 to 2-8 are at the low level.

The above-described system has the following problem. Let us consider what will be the actual voltage during reading in a situation in which the power supply voltage Vcc is 5 V and the writing voltage is also 5 V in the circuit shown in FIG. 2.

Assume that the substrate potential is 0 V, the threshold of the enhancement-type NMOS transistor when there is no back-bias effect is set at 0.8 V and the threshold of the depletion-type NMOS transistor when there is no back-bias effect is set at −2.0 V, and the threshold of the intrinsic-type NMOS transistor when there is no back-bias effect is set at 0 V.

When the word line 2-1 is selected, the internal address signals a1, a2 and a3 which are at the low level are input and the NMOS transistors 12, 13 and 14 are turned off. The threshold of the depletion type NMOS transistor 11 is −1.8 V because of the back-bias effect due to the 5 V source voltage, so that the NMOS transistor 11 drives the node N1 to 5 V. The threshold of the enhancement-type NMOS transistor 18 is now 1 V because of the back-bias effect, so that it drives the node N3 to 4 V. The node N3 is thereafter gradually driven to 9 V by the booster circuit 20. When high-level internal address signals a4, a5, a6 are input to the AND gates 40-1 to 40-8 the predecode signal Pr1 is driven to the high level of 5 V. The inverted predecode signal $\overline{Pr1}$ becomes the low level and the NMOS transistor 31-1 is turned off. Because the enhancement-type NMOS transistor 30-1 has the threshold 1 V with the back-bias effect, the word line 2-1 is driven only to 4 V which is the gate voltage 5 V of the NMOS transistor 30-1 minus the threshold 1 V. This means that during reading, the voltage applied to the gate of the NMOS transistor 30-1 is not sufficient and the potential of the word line 2-1 is lowered. As a result, the drain current through the selected unwritten memory cell is decreased and the reading speed is lowered.

SUMMARY OF THE INVENTION

An object of the invention is to increase the speed of the reading operation of an EPROM system.

According to the invention, there is provided an EPROM system comprising a memory cell array formed of a matrix of non-volatile semiconductor memory cells, each having a control gate and a floating gate, and storing electric charges on the floating gate, and a word line drive circuit driving word lines respectively connected to the control gates of the respective memory cells, wherein said word line drive circuit comprises:

means for producing a first selection signal;
means for producing a second selection signal;
a delay circuit for delaying said first selection signal;
a boosting capacitor having a first electrode connected to said first selection signal and a second electrode connected the output of the delay circuit; and
MOS transistors each having a gate electrode connected to said second electrode of said boosting capacitor, a first electrode connected to receive the second selection signal and a second electrode connected to the word line.

BRIEF DESCRIPTION OF THE DRAWINGS

FIG. 4 is a diagram showing an EPROM system according to an embodiment of the invention.

FIG. 9 is a time chart showing the voltages in the circuit of FIG. 8.

DETAILED DESCRIPTION OF THE EMBODIMENTS

Figure 1:
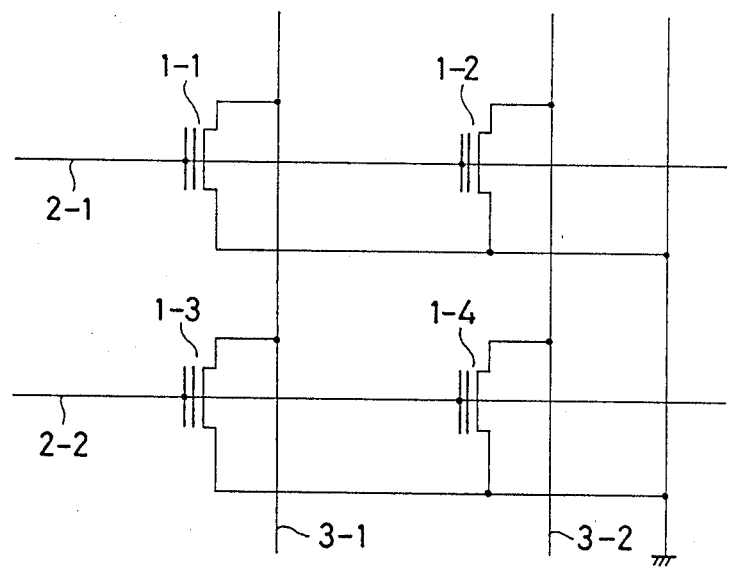
FIG. 1 is a diagram showing a conventional EPROM system.
Figure 3:
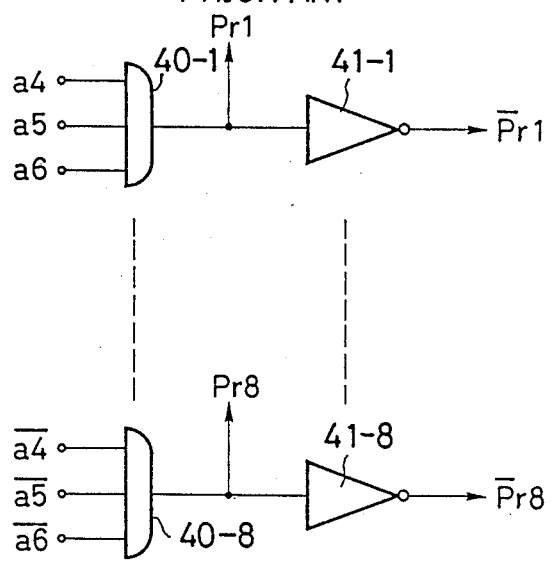
FIG. 3 is a circuit diagram showing the predecode circuit of FIG. 2.
Figure 2:
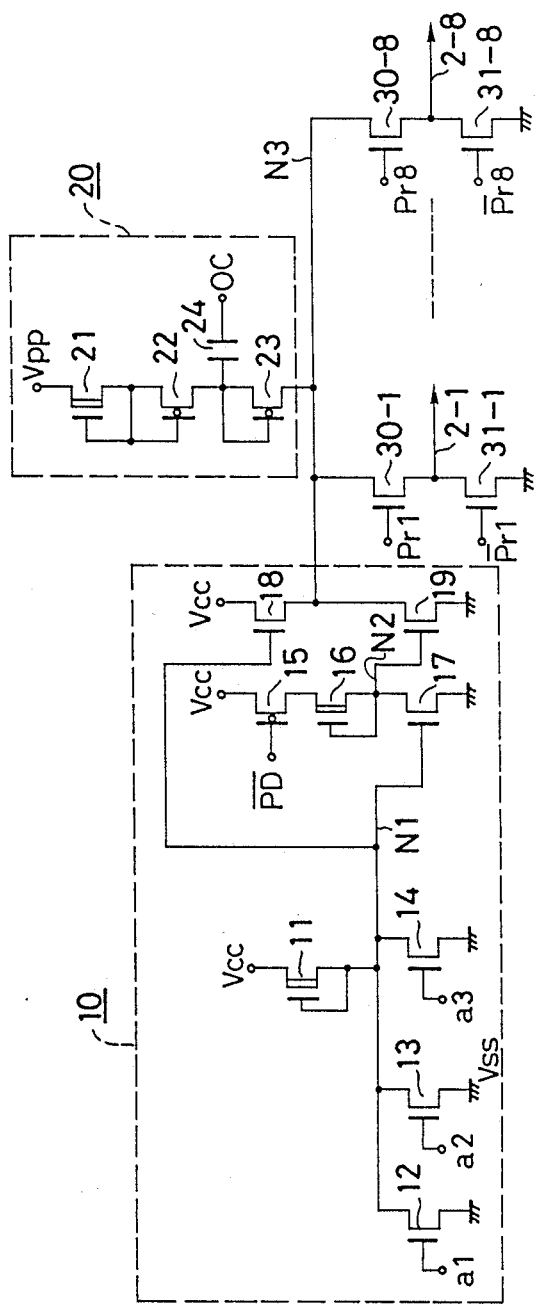
FIG. 2 is a circuit diagram showing the word line drive circuit in the EPROM system of FIG. 1.

An embodiment of the EPROM system according to the invention shown in FIG. 4 comprises memory cell array 48, a selector circuit 49, a predecode circuit 130 and a word line drive circuit 46. The memory cell array 48 is divided into four memory cell blocks, all denoted by 50. The selector circuit 49 is controlled by the word line drive circuit 46 to select one of the four memory cell blocks 50. The selector circuit 49 is divided into four selector sections 120 respectively associated with the memory cell blocks 50. The word line drive circuit 46 is also divided into four word line drive sections 47 respectively associated with the selector sections 120, and hence with the memory cell blocks 50.

Figure 5:
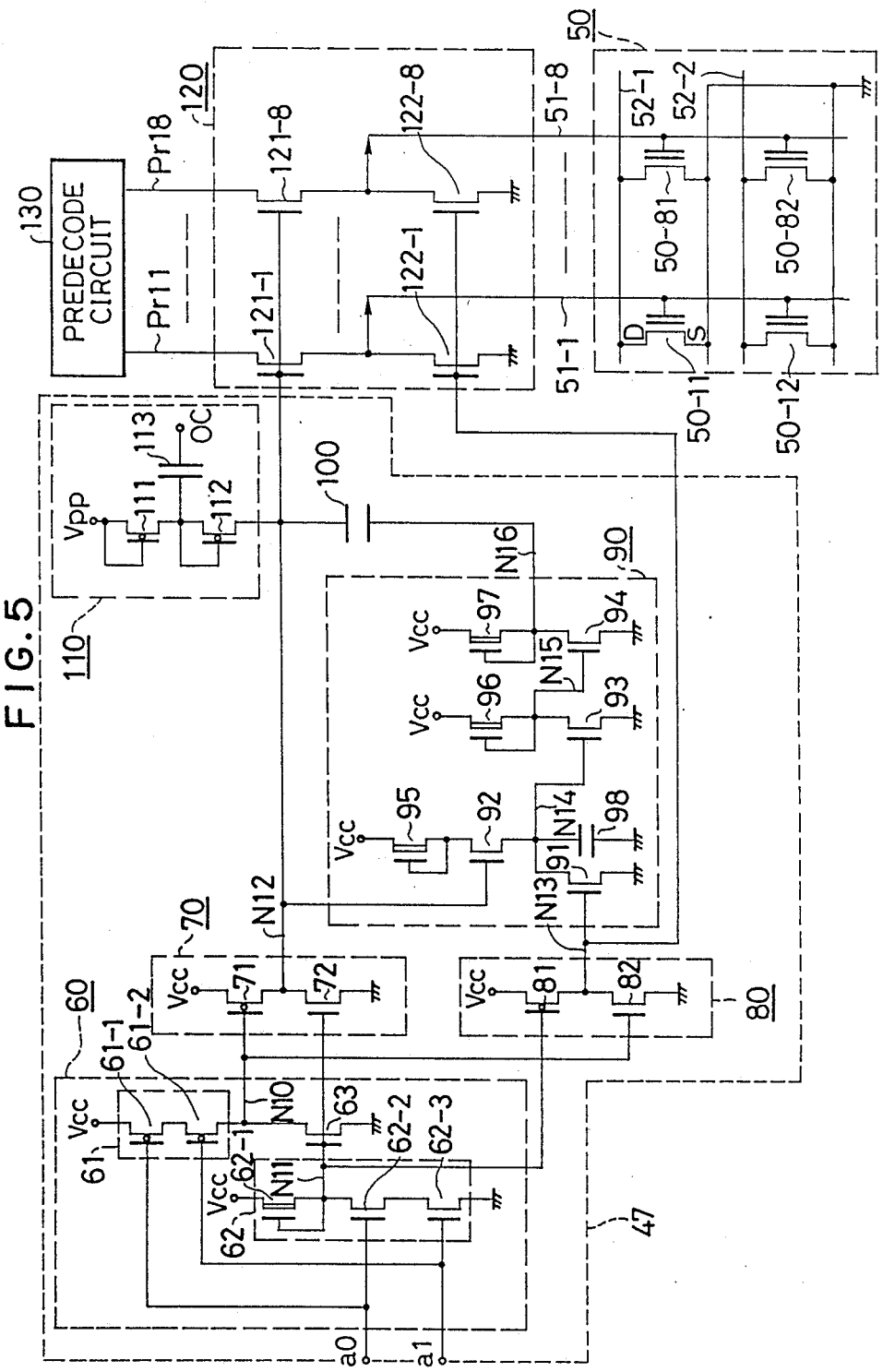
FIG. 5 is a diagram showing part of the EPROM system including a memory cell block, part of a selector circuit associated with the block and part of a word line drive circuit associated with the above-mentioned memory cell block.

In FIG. 5, one of the memory cell blocks 50, one of the selector sections 120 associated with the above-mentioned one of the memory cell blocks 50, and one of the word line drive sections 47 associated with the above-mentioned one of the selector sections 120 are illustrated.

The illustrated memory cell block 50 include memory cells 50-11 to 50-81, 50-12 to 50-82, etc. The control gates of the memory cells 50-11, 50-12 and 50-81, 50-82 which are aligned in the vertical direction are respectively connected together to word lines 51-1 to 51-8. The drains of the memory cells 50-11 to 50-81 and 50-12 to 50-82, etc. which are aligned in the horizontal direction are respectively connected together to bit lines 52-1, 52-2, etc. The sources of the memory cells 50-11 to 50-81, 50-12 to 50-82, etc. are all connected to ground (0 V).

The illustrated selector section 120 comprises enhancement-type NMOS transistors 121-1 to 121-8 whose gates are all connected to the node N12. The NMOS transistors 121-1 to 121-8 are connected to receive at their drains (first electrodes) predecode signals Pr11 to Pr18 as second selection signals. The sources (second electrodes) of the NMOS transistors 121-1 to 121-8 are connected to the word lines 51-1 to 51-8. The selector circuit 120 also comprises enhancement-type NMOS transistors 122-1 to 122-8 whose drains are connected to the sources of the NMOS transistors 121-1 to 121-8, respectively. The gates of the NMOS transistors 122-1 to 122-8 are all connected to the node N13. With the above configuration, the selector section 120 selectively connects the word lines of the associated memory cell block 50 to the predecode signals Pr11 to Pr18 or to ground. The gates of all the enhancement-type NMOS transistors 121-1 to 121-8 in the selector section 120 are connected together to the node N12, and all the NMOS transistors 121-1 to 121-8 are simultaneously turned on and off by a gate control signal at the node N12. Similarly, the gates of all the enhancement-type NMOS transistors 122-1 to 122-8 are connected together to the node N13, and all the NMOS transistors 122-1 to 122-8 are simultaneously turned on and off by a gate control signal at the node N13. Each of the three other selector sections 120 have the same structure.

The illustrated word line drive section 47 comprises a logic circuit 60, two drive circuits 70 and 80, a delay circuit 90, a boosting capacitor 100, and a booster circuit 110.

The logic circuit 60 outputs high-level and low-level signals when a plurality of signals for word line selection, such as internal address signals a0 and a1 are input during the data reading operation. The logic circuit 60 comprises an AND gate 61 producing a logical product of the internal address signals a0 and a1 to a node N10, a NAND gate 62 producing an inversion of a logical product of the internal address signals a0 and a1 and enhancement-type NMOS transistor 63 the gate of which is connected to the node N11. The AND gate 61 comprises intrinsic-type NMOS transistors 61-1 and 61-2 connected in series between the power supply Vcc and the node N10. The node N10 is connected through a NMOS transistor 63 to ground. The NAND gate 62 includes a depletion-type NMOS transistor 62-1 connected between the power supply Vcc and the node N11 and enhancement-type NMOS transistors 62-2 and 62-3 connected in series between the node N11 and ground.

The logic circuits 60 in the other three word line drive sections 47 are provided to receive, in place of the internal address signals a0 and a1 in the case of the illustrated circuit, the internal address signals a0 and $\bar{a}1$, $\bar{a}0$ and a1, and $\bar{a}0$ and $\bar{a}1$, respectively.

One of the two drive circuits, 70, supplies the node N12 with a control high-level signal having a current supply capacity when it receives a high-level signal from the node N10 during word line selection. The drive circuit 70 comprises an intrinsic-type NMOS transistor 71 and an enhancement-type NMOS transistor 72 which are connected in series between the power supply Vcc and the ground. The output of the drive circuit 70 is used as a first selection signal. The other drive circuit 80 supplies the node N13 with a control low-level signal having a current supply capacity when it receives a low-level signal from the node N11 during word line selection. The drive circuit 80 comprises an intrinsic-type NMOS transistor 81 and an enhancement-type NMOS transistor 82 connected in series between the power supply Vcc and ground.

The delay circuit 90 is controlled by a signal at the node N13 and delays the signal from the node N12 by a predetermined time. The delay circuit 90 comprises enhancement-type NMOS transistors 91, 92, 93 and 94, depletion-type NMOS transistors 95, 96 and 97, and a capacitor 98. The NMOS transistor 91 and the capacitor 98 are connected in parallel with each other between the node N14 and ground. The NMOS transistors 95 and 92 are connected in series between the power supply Vcc and the node N14. The NMOS transistor 96 is connected between the power supply Vcc and the node N15. The NMOS transistor 93 is connected between the node N15 and ground. The NMOS transistors 97 and 94 are connected in series between the power supply Vcc and ground. The junction between these NMOS transistors 97 and 94 is the node N16. When the node N12 is changed from the low level to the high level, the delay circuit 90 drives the node N16 from the low level to the high level, after a predetermined time. When the node N13 is changed from the low level to the high level, the delay circuit 90 drives the node N16 from the high level to the low level at a high speed. The node N12 is connected to the node N16 through the boosting capacitor 100 which boosts the voltage on the node N16.

The booster circuit 110 holds the potential boosted by the boosting capacitor 100. It comprises intrinsic-type NMOS transistors 111 and 112 connected in series between the terminal for receiving the writing voltage Vpp and the node N12, and a capacitor 113 connected between the junction between the NMOS transistors 111 and 112, and the terminal for receiving the oscillating signal OC.

The predecode circuit 130 determines the logical product of the internal address signals to produce the predecode signals Pr11 to Pr18.

Figure 6:
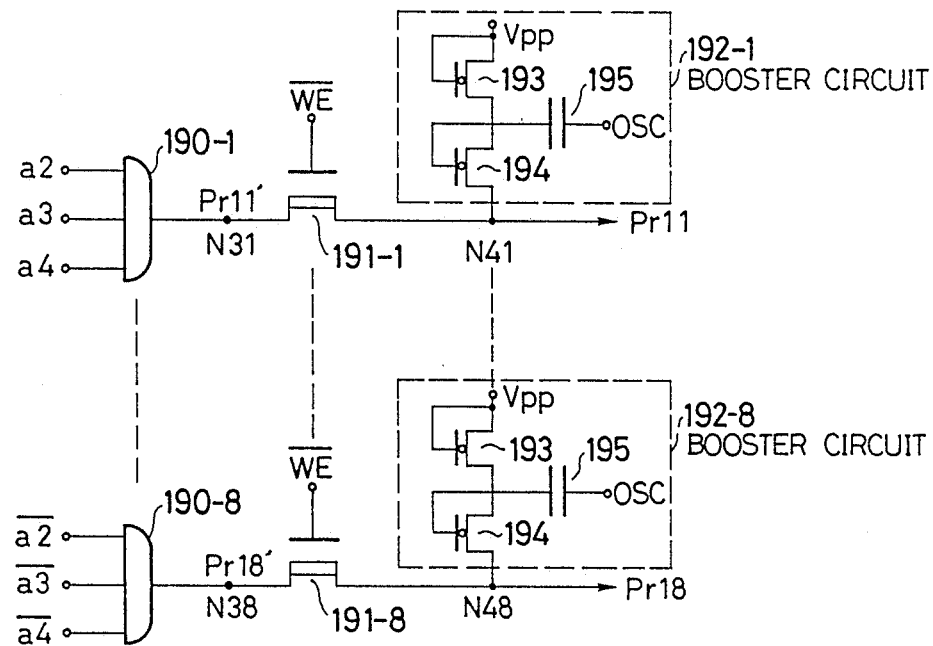
FIG. 6 is a circuit diagram showing the predecode circuit of FIG. 5.

FIG. 6 is a circuit diagram showing an example of the predecode circuit 130 in FIG. 5.

The predecode circuit shown in FIG. 6 comprises AND gates 190-1 to 190-8. Supplied to the respective AND gates 190-1 to 190-8 are complementary internal address signals a2, a3, a4; a2, a3, $\bar{a}$4; a2, $\bar{a}$3, a4; a2, $\bar{a}$3, $\bar{a}$4; $\bar{a}$2, a3, a4; $\bar{a}$2, a3, $\bar{a}$4; $\bar{a}$2, $\bar{a}$3, a4; $\bar{a}$2, $\bar{a}$3, $\bar{a}$4. The AND gates 190-1 to 190-8 output the predecode signals Pr11' to Pr18'. For instance, when the internal address signals a2, a3 and a4 are all at the high level, the AND condition of the AND gate 190-1 is satisfied, and the predecode signal Pr11' at the output of the AND gate 190-1 is at the high level, while other predecode signals Pr12' to Pr18' are all at the low level. The AND gates 190-1 to 190-8 are driven by a read power supply Vcc, e.g., 5 V. The nodes N31 to N38 are therefore driven up to 5 V. The predecode circuit 130 further comprises depletion-type NMOS transistors 191-1 to 191-8, whose gates are all connected to receive an inverted write enable control signal $\overline{WE}$. The inverted write enable control signal $\overline{WE}$ is high (5 V) during the reading operation, and is low (0 V) during the writing operation. The NMOS transistors 191-1 to 191-8 are therefore conductive during reading. The outputs Pr11 to Pr18 of the predecode circuit 130 are the outputs Pr11' to Pr18' of the AND gates 190-1 to 190-8, i.e., 5 V or 0 V depending on the values of the internal address signals. That is, when the output of one of the AND gates 190-1 to 190-8, e.g., the output Pr11' of the AND gate 190-1, whose inputs satisfy the AND condition, is high (5 V), the corresponding output, Pr11 at the node N41, of the predecode circuit 130 is high, and the remaining outputs Pr12 to Pr18 at the nodes 42 to 48 are low (0 V). The predecode circuit 130 further comprises booster circuits 192-1 to 192-8, each comprising intrinsic-type NMOS transistors 193 and 194, a capacitor 195 and a terminal receiving an oscillating signal OSC. The terminal Vpp is 12.5 V, for example. During writing, the inverted write enable control signal $\overline{WE}$ is low (0 V), the output of one of the AND gates 190-1 to 190-8, e.g., 190-1, whose inputs satisfy the AND condition is 5 V, and the nodes N41 to N48 are gradually boosted up to about 15 V. The NMOS transistors 191-1 is then back-biased and is therefore turned off. The output Pr11 at the node N41 of the predecode circuit 130 therefore becomes a higher voltage suitable for writing. The outputs of the other AND gates, 190-2 to 190-8 whose inputs do not satisfy the AND condition, are low (0 V), so that the nodes N42 to N48 are low (0 V). Thus, the NMOS transistors 190-1 to 190-8 serve as switches for selectively producing a lower, read voltage (5 V) on the selected predecode line (e.g., Pr11) and 0 V on the unselected predecode lines Pr12 to Pr18 during reading, and for selectively producing a higher (boosted), write voltage (15 V) on the selected predecode line (Pr11) and 0 V on the unselected predecode lines Pr12 to Pr18 during writing.

As was stated earlier, FIG. 5 illustrates a single word line drive section 47 and a single selector section 120, which are part only of the word line drive circuit 46 and the selector circuit 49 (FIG. 4) which are associated with the memory cell block 50. The EPROM system also includes three similar word line drive sections 47 and three similar selector sections 120. It is however noted that the logic circuits 60 in the other three word line drive sections 47 are provided to receive, in place of the internal address signals a0 and a1 in the case of the illustrated circuit, the internal address signals a0 and $\overline{a1}$; $\overline{a0}$ and a1; and $\overline{a0}$ and $\overline{a1}$, respectively.

Each of the three other selector sections 120 have the same structure but receive gate control signals from different word line drive sections 47 and the NMOS transistors in the respective selector sections 120 are turned on and off at different timings, i.e., depending on whether or not the associated memory cell block 50 is selected by the internal address signal supplied to the associated word line drive section 47.

The operation of the EPROM system having the above configuration will be described next with reference to FIG. 7.

Figure 7:
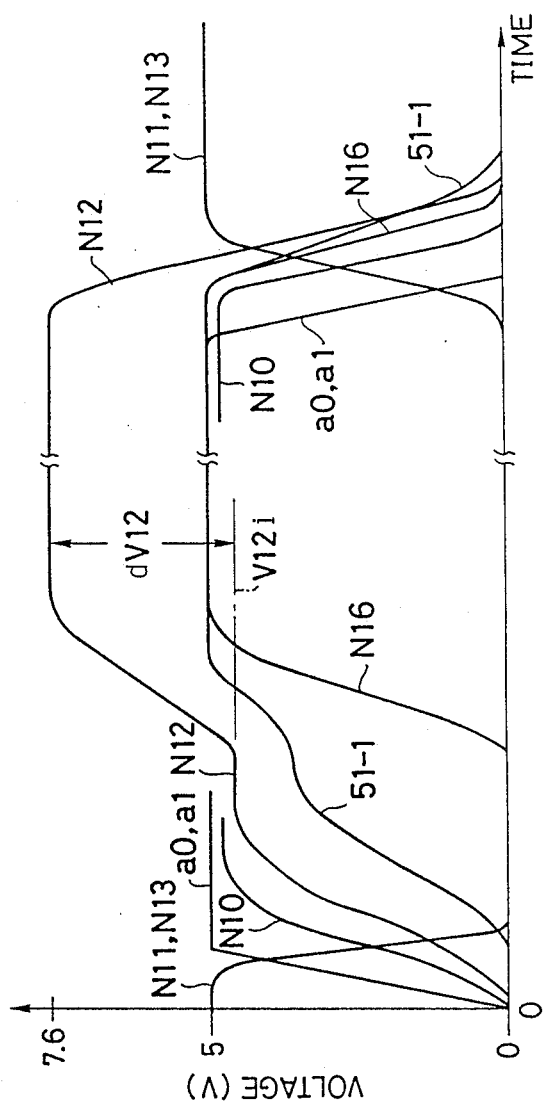
FIG. 7 is a time chart showing the voltages in the system of FIG. 5.

FIG. 7 shows the voltages on various nodes when the internal address signal a0 is changed from the low level to the high level to select the word line 51-1. It is assumed that the substrate potential is 0 V, the power supply Vcc is 5 V, and the writing voltage Vpp is 5 V. The enhancement-type NMOS transistors have a threshold voltage of 0.8 V under no back-bias condition; the depletion-type NMOS transistors have a threshold voltage of 2.0 V under no back-bias condition; and the intrinsic-type NMOS transistors have a threshold voltage of 0 V under no back-bias condition.

(i) First, it is assumed that the predecode signal Pr11 is at the high level, the predecode signals Pr12 to Pr18 are at the low level, and the internal address signal a1 is at the high level, and the internal address signal a0 is changed from the low level to the high level to select the word line 51-1.

When the internal address signal a0 is changed from the low level to the high level, as shown in FIG. 7, and the two internal address signals a0 and a1 have come to assume the high level, the NAND gate 62 of the logic circuit 60 makes the node N11 the low level and the NMOS transistor 63 is turned off. The NMOS transistors 61-1 and 61-2 are turned on because the internal address signals a0 and a1 are at the high level. The node N10 therefore becomes the high level, as shown in FIG. 7. As the NMOS transistor has a threshold voltage of 0.2 V under back-bias condition, the node N10 is driven to 4.8 V. The on-state conductances of the NMOS transistors 61-1 and 61-2 are set to be a relatively small value. This is to reduce the load capacity of the internal address signal and increase the driving of the internal address signal. The current driving capacity of the series connected NMOS transistors 61-1 and 61-2 is small. It is for this reason that the drive circuit 70 is used to increase the current driving capacity.

In the drive circuit 70, the node N10 is at the high level, the node N11 is at the low level, the NMOS transistor 71 is at the on state, the NMOS transistor 72 is at the off state, and the node N12 is at the high level, as shown in FIG. 7. The NMOS transistor 71 has a threshold of 0.2 V under back-bias condition, so that the node N12 is driven once to 4.6 V. The NMOS transistors 62-2 and 62-3 are also made to have relatively small on-state conductances, as with the NMOS transistors 61-1 and 61-2. Therefore, the drive circuit 80 is provided to increase the driving capacity. In the drive circuit 80, the node N10 is at the high level, the node N11 is at the low level, the NMOS transistor 81 is in the off state, the NMOS transistor 82 is in the on state, and the node N13 becomes the low level, as shown in FIG. 7. When the node N12 becomes high, and the node 13 becomes low, the NMOS transistor 121-1 is turned on and the NMOS transistor 122-1 is turned off. The drain of the NMOS transistor 121 is being supplied with the high-level (=5 V) predecode signal Pr11 so that the selected word line 51-1 begins being driven to the high level by the NMOS transistor 121-1. When the node N12 is driven to 4.6 V, the word line 51-1 is driven to 3.6 V. The difference is the threshold 1.0 V of the NMOS transistor 121-1 with the back-bias effect.

Next, in the delay circuit 90, when the node N12 rises to the high level and the NMOS transistor 92 is turned on the node N14 that has been driven to 0 V by the NMOS transistor 91 when unselected rises to a higher voltage. The speed at which the voltage rises is dependent on the capacitance of the capacitor 98 and the conductance of the NMOS transistor 95. When the voltage rising speed is set low, the voltage on the node N14 gradually rises to the high level. When the voltage on the node N14 exceeds the threshold voltage 0.8 V of the NMOS transistor 93 under no back-bias condition, the node N15 falls from the high level to the low level and the node N16 rises from the low level to the high level. Thus, the node N12 rises from the low level to the high level, and thereafter the node N16 rises from the low level to the high level at a predetermined time, as shown in FIG. 7. If the gate of the NMOS transistor 92 is connected to the node N10, instead of the node N12, the same result is obtained. When the voltage on the node N16 rises, the voltage on the node N12 is boosted by the capacitor 100. The increment dV12 is given by the following equation.

$$dV12 = dV16 \, C100/(C100 + C12A) \quad (1)$$

where
dV16 is the increment of the voltage on the node N16,
C100 is the capacitance of the capacitor 100, and
C12A is the total of the capacitances connected to the node 12 excepting the capacitor 100 (including the gate capacitances of the NMOS transistors 121-1 to 121-8).

The voltage V12 on the node N12 is given by the following equation, derived from equation (1) and the voltage V12i before the boosting (i.e., the voltage shown by a phantom line V12i in FIG. 7, which would result if the boosting does not occur).

$$V12 = V12i + dV16 \, C100/(C100 + C12A) \quad (2)$$

If the circuit elements are selected such that C100/(C100+C12A) is 0.6, the voltage V12 after the boosting is:

$$V12 = 4.6 + 5 \times 0.6 = 7.6$$

As a result, the voltage of the selected word line 51-1 is rapidly raised to 5 V by the NMOS transistor 121-1. The voltage V12 on the node N12 is gradually boosted by the booster circuit 110, and its steady-state value is the upper limit value (e.g., 9 V) determined by the configuration of the booster circuit 110.

The explanation has been given for a situation in which the predecode signal Pr11 is at the high level, the predecode signals Pr12 to Pr18 are at the low level, the internal address signal a1 is at the high level, the internal address signal a0 is changed from the low level to the high level to select the word line 51-1. The operation when the internal address signal a1, instead of the internal address signal a0, rises from the low level to the high level is similar.

(ii) Next, the operation will be described when the internal address signals a0 and a1 are at the high level, and the predecode signal Pr11 rises from the low level to the high level and the predecode signal Pr18 falls from the high level to the low level to select the word line 51-1.

Since the internal address signals a0 and a1 are at the high level, the node N12 is at least at 7.6 V and the node N13 is at the low level, as was described in (i) above. Accordingly, the NMOS transistors 121-1 and 121-8 are in the on state and the NMOS transistors 122-1 and 122-8 are in the off state. Before the predecode signals Pr11 and Pr18 are changed, the predecode signal Pr11 is at the low level and the predecode signal Pr18 is at the high level, and the word line 51-1 is driven to the low level (=0 V) by the NMOS transistor 121-1 and the word line 51-8 is driven to the high level (=5 V). When the predecode signal Pr11 is driven from the low level (=0 V) to the high level (=5 V), the word line 51-1 is driven from the low level (=0 V) to the high level (=5 V). When the predecode signal Pr18 is driven from the high level (=5 V) to the low level (=0 V), the word line 51-8 is driven from the high level (=5 V) to the low level (=0 V).

Thus in each of the situations (i) and (ii), the word line 51-1 that is selected during reading is quickly driven to the power supply voltage.

The reason why the booster circuit 110 is provided is now explained.

If the booster circuit 110 were not provided, the voltage on the node N12 that has once been boosted to 7.6 V by the capacitor 100, would drop due to the junction leak current and would ultimately become 4.6 V supplied from the drive circuit 70. If the predecode signal were changed after the node N12 has fallen to 4.6 V, the selected word line would become only 3.6 V. The booster circuit 110 is provided to avoid this and boost the node N12.

Moreover, the booster circuit 110 is also necessary to generate a high voltage to be supplied to the selected word line during writing. During writing of an EPROM, a power supply voltage of 5 V and a high writing voltage of, say, 12.5 V is applied. The booster circuit 110 gradually boosts the node N12 to 17 V. The selected predecode signal Pr11 becomes 12.5 V during writing being driven by the writing voltage Vpp and the selected word line can be driven to 12.5 V. When the predecode signal Pr11 is driven by the writing voltage Vpp to 15 V, the selected word line can be driven to 15 V. Thus, by use of the booster circuit 110, a voltage higher than the writing voltage Vpp can be applied to the word line.

In the case of reading in (i) above, there are instances when the selected word line is not quickly driven to the desired voltage under certain limited input conditions and certain limited circuit element parameter settings. This will be explained next.

The above-mentioned "limited input conditions" are the conditions in which internal address signal a0 or a1 is changed from the high level to the low level and then again to the high level, and the period for which it remains in the low level is relatively short (e.g., 5 ns). The above-mentioned "limited circuit element parameter settings" are such that the NMOS transistor 91 of the delay circuit 90 has a small driving capacity and cannot drive the node N14 to the low level while the internal address signal a0 or a1 is at the low level under the above-mentioned input conditions, and hence the node N16 maintains the high level (=5 V).

In the above condition, the dV16 in the equation (2) is 0V. The voltage V12 on the node N12 is driven to the low level by the NMOS transistor 72 when the node N11 rises to the high level while the internal address signal a0 or a1 is at the low level. Subsequently, the internal address signal a0 or a1 rises to the high level and the node N10 rises to 4.8 V, and the node N12 is driven to 4.6 V by the NMOS transistor 71, but is not boosted by the capacitor 100. As a result, the selected word line 51-1 is quickly driven only to 3.6 V. Subsequently, the node N12 is gradually boosted by the booster circuit 110 and the word line 51-1 thereby rises, but this does not contribute to high-speed reading.

Where it is expected that the above situation arises, the following measure can be adopted.

That is, the internal address signal generator circuit, e.g., in the address buffer circuit, can be made to include a waveform shaping circuit, which functions to hold the internal address signala0 and a1 at the low level for a predetermined period once the internal address signal falls to the low level. By modifying the internal address signals a0 and a1 to have the low level for at least a predetermined period, the node N12 can be made low (=0 V) and the node N16 can be made low (=0 V), so that dV16 can be made 5 V as in the ordinary condition. As a result, the node N12 can be boosted to 7.6 V by use of the capacitor 100 and accordingly the selected word line can be quickly driven to the power supply voltage.

Figure 8:
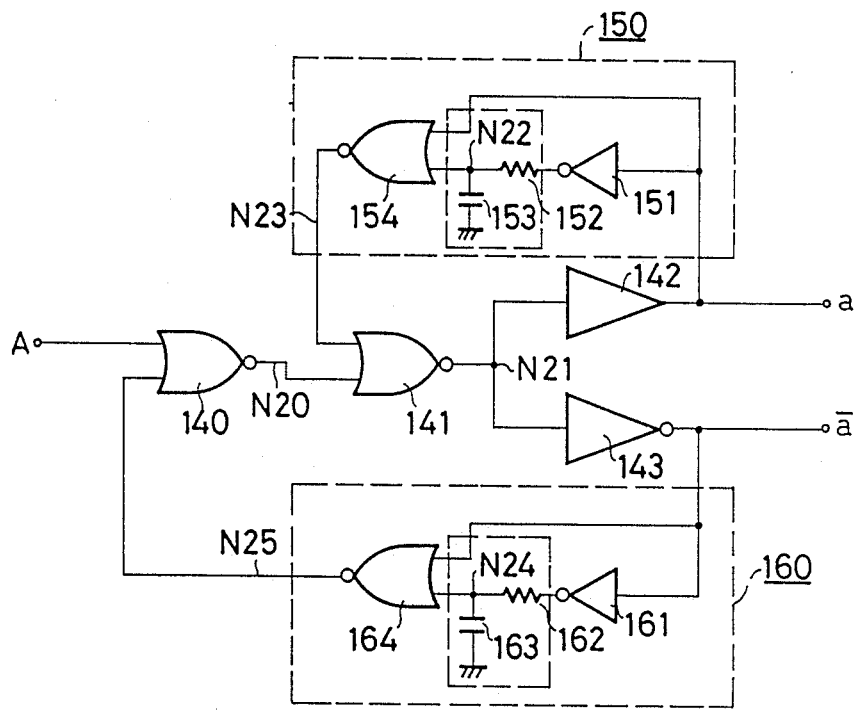
FIG. 8 is a circuit diagram showing an internal address signal generator in FIG. 5.

FIG. 8 shows an example of an internal address signal generator circuit having a waveform shaping function.

The illustrated internal address signal generator circuit comprises NOR gates 140 and 141, a driver circuit 142, an inverter 143, and two single pulse generator circuits 150 and 160. One of the single pulse generator circuits, 150, comprises an inverter 151, a delay circuit formed of a resistor 152 and a capacitor 153, and a NOR gate 154. Similarly, the other single pulse generator circuits 160 comprises an inverter 161, a delay circuit formed of a resistor 162 and a capacitor 163, and a NOR gate 164. Reference character A denotes an external address signal, a (=a0 or a1) denotes an internal address signal in phase with the external address signal A. a̅ denotes an internal address signal with the opposite phase. N20 to N25 denote nodes.

The single pulse generating circuit 150 receives the internal address signal a and outputs a single pulse onto the node N23. The single pulse generating circuit 160 receives the inverted internal address signal a̅ and outputs a single pulse onto the node N25. The NOR gate 140 receives the external address signal A and the signal on the node N25, and outputs an inversion of the logical sum onto the node N20. The NOR gate 141 receives the signals on the nodes N23 and N20, and outputs an inversion of the logical sum onto the node N21. The driver circuit 142 receives the signal on the node N21 and outputs an internal address signal a with the same phase and with an increased driving capacity. The inverter 143 receives the signal on the node N21 and outputs an inverted internal address signal with the opposite phase and with an increased driving capacity.

FIG. 9 shows voltages on various nodes when the power supply Vcc is 5 V and the external address signal A is changed from the high level to the low level and then again to the high level.

In the single pulse generating circuit 150, in the steady state, the inputs to the NOR gate 154 are complementary signals so its output, which is also the output of the single pulse generating circuit 150, on the node N23 is at the low level. Similarly, the node N25, which is the output of the single pulse generating circuit 160, is also at the low level in the steady state. As is shown in FIG. 9, when the external address signal A is changed from the high level to the low level at time t1, the nodes N23 and N25 are at the low level. The node N20 rises to the high level and the node level 21 becomes low, so the internal address signal a becomes low after a certain delay time, at time t2.

When the internal address signal a becomes low at time t2, the node N22 rises from 0 V gradually because of the delay circuit formed of the resistor 152 and the capacitor 153, and reaches the high level at time t4. Since the node N22 does not becomes high immediately, but remains low for a predetermined time the inputs to the NOR gate 154 are both at the low level and the node N23 becomes high. When the node N23 becomes high, the NOR gate 141 maintains the node N21 low irrespective of the voltage level of the node N20. When the external address signal A is changed from the low level to the high level at time t3, the internal address signal a is kept low. When the node N22 reaches the high level voltage at time t4, the node N23 becomes low, and since the node N20 is low, the node N21 becomes high, and after a certain delay time, at time t5, the internal address signal a becomes high. That is, once the internal address signal a becomes low (e.g., at time t2), it remains low for a predetermined time (e.g., from t2 to t5) irrespective of the level change of the external address signal A. Thus, the internal address signal a is a waveform-shaped signal as mentioned above.

The merits of this embodiment can be summarized as follows:

In the word line drive circuit of the above embodiment, the selected word lines 51-1 to 51-8 can be driven to the power supply voltage at a high speed, so high-speed reading of the memory cells is possible. With the waveform shaping function, when the internal address signals a0 and a1 are changed from the high level to the level, the internal address signals are maintained at the low level for a predetermined time. This arrangement is useful under the conditions of the limited circuit element parameter settings of the word line drive circuit. The word line drive circuit can be made to operate as in the ordinary conditions and the selected word lines 51-1 to 51-8 can be quickly driven to the power supply voltage level.

The invention is not limited to the embodiments described above, but various modification can be made without departing from the sprit of the invention. The following are some examples of the modification.

(a) In the logic circuit in FIG. 5, the input signals are internal address signals a0 and a1, but the input signals may alternatively be the predecode signals which are the logical products of the internal address signals.

(b) The driver circuits 70 and 80 may be formed of other circuits such as bootstrap circuit or the like.

(c) The circuit for waveform-shaping the signal to be input to the logical circuit 60 can be formed of NAND gates or the like, instead of the NOR gates as in FIG. 8.

(d) In place of the predecode signals Pr11 to Pr18, the internal address signals may be supplied to the drains of the NMOS transistors 121-1 to 121-8.

(e) The drive circuit 80 may be omitted, and the node N11 may be directly connected to the node N13.

(f) The NMOS transistors in FIG. 5 may be replaced by PMOS transistors. The bit number can be other than that described.

As has been described, according to the invention, the word line drive circuit comprises a logic circuit, the drive circuit, the delay circuit, the boosting capacitor and MOS transistors, so the selected word lines can be quickly driven to the power supply voltage level, and high-speed reading of the memory cells is possible.

What is claimed is:

1. An erasable and programmable read-only memory system, comprising:

(a) a memory cell block including a plurality of memory cells arranged in a matrix comprising at least first and second groups, each of said memory cells having a first electrode, a second electrode and a control gate, the first electrodes of the memory cells of each of said groups being connected to form a bit line for that group, the second electrodes of the memory cells of said first and second groups being connected to a common reference potential, and the control gate of each of said memory cells of said first group being connected to a corresponding control gate of a memory cell of said second group to form a plurality of word lines, a predetermined writing potential being applied to the control gate of each semiconductor device for writing therein;

(b) a logic circuit for generating a selection signal and an inversion thereof in response to a first internal address signal, said logic circuit comprising
input terminal means for receiving said first internal address signal;
a first output terminal for outputting said selection signal; and
a second output terminal for outputting an inversion signal inverse to said selection signal;

(c) a delay circuit for delaying said selection signal comprising;
an input terminal connected to said first output terminal of said logic circuit;
a control terminal connected to the second output terminal of said logic circuit for receiving said inversion signal; and
an output terminal for outputting a delayed signal obtained by delaying said selection signal, said delay circuit being controlled by the inversion signal to produce said delayed signal;

(d) a boosting capacitor having a first terminal connected to the first output terminal of said logic circuit and a second terminal connected to the output terminal of said delay circuit;

(e) a voltage boosting circuit connected to the first terminal of said boosting capacitor for raising the potential on the first terminal thereof above said writing potential for said memory cells;

(f) a predecode circuit for selectively supplying a plurality of predecode signals at said writing potential in response to a second internal address signal at the time of writing, said predecode circuit having a plurality of output terminals for outputting said predecode signals; and (g) a selector circuit for applying selected predecode signals to said word lines, said selector circuit comprising:
a first group of transistors, each having a first electrode connected to the corresponding one of the output terminals of said predecode circuit, a second electrode connected to a corresponding one of said word lines, and a gate connected to the first terminal of said boosting capacitor; and
a second group of transistors corresponding to the first group of transistors, each having a first electrode connected to the corresponding one of said word lines, a second electrode connected to said reference potential, and a gate connected to the second output terminal of said logic circuit.

2. The system according to claim 1, which further comprises:
a first drive circuit interposed between the first output terminal of said logic circuit and the input terminal of said delay circuit, said first drive circuit providing said selection signal with an increased driving capacity; and
a second drive circuit interposed between the second output terminal of said logic circuit and the control terminal of said delay circuit, said second drive circuit providing said inversion signal with an increasing driving capacity.

3. The system according to claim 2, wherein the delay time of said delay circuit is such that after said selection signal has risen to a predetermined level, the output of said delay circuit begins to increase.

4. The system according to claim 2, further comprising a signal generator circuit connected to the input terminal means of said logic circuit for producing said first internal address signal, said signal generator circuit maintaining the internal address signal at a low level for a predetermined time when the level of the internal address signal changes from a high level to a low level.

5. The system according to claim 1, wherein said delay circuit further comprises:
a first transistor having a first electrode connected to said reference potential, a second electrode, and a gate connected to the control terminal of said delay circuit, said gate receiving said inversion signal;
a capacitor having first and second electrodes connected across the first and second electrodes of said first transistor; and
a second transistor having a first electrode connected to the second electrode of said capacitor, a second electrode connected to a potential source, and a gate connected to the input terminal of said delay circuit, said gate receiving said selection signal, the voltage at the junction of said capacitor and said first and second transistors increaing at a predetermined rate.

6. The system according to claim 5 which further comprises a third transistor interposed between said second transistor and said potential source, the capacitance of said capacitor and the conductance of said third transistor determining the rate at which the voltage at said junction increases.

7. The system according to claim 1 wherein each of said memory cells is further provided with a floating gate for storing electric charges thereon.

8. An erasable and programmable read-only memory system, comprising:
(a) a plurality of memory devices, each having an input means, divided into at least two groups, the input means of the memory devices in each of said groups being connected to a common word line to provide a word line for each of said groups, predetermined writing potentials being applied to said word lines for writing in said memory devices;

(b) a logic circuit for generating a selection signal and an inversion thereof in response to a first internal address signal, said logic circuit comprising
input terminal means for receiving said first internal address signal;
a first output terminal for outputting said selection signal; and
a second output terminal for outputting an inversion signal inverse to said selection signal;

(c) a delay circuit for delaying said selection signal comprising;
an input terminal connected to said first output terminal of said logic circuit;

a control terminal connected to the second output terminal of said logic circuit for receiving said inversion signal; and an output terminal for outputting a delayed signal obtained by delaying said selection signal, said delay circuit being controlled by the inversion signal to produce said delayed signal;

(d) a boosting capacitor having a first terminal connected to the first output terminal of said logic circuit and a second terminal connected to the output terminal of said delay circuit;

(e) a voltage boosting circuit connected to the first terminal of said boosting capacitor for raising the potential on the first terminal thereof above said writing potential for said memory devices;

(f) a predecode circuit for selectively supplying a plurality of predecode signals at said writing potential in response to a second internal address signal at the time of writing, said predecode circuit having a plurality of output terminals for outputting said predecode signals; and (g) a selector circuit for applying selected predecode signals to said word lines, said selector circuit comprising:

a first group of transistors, each having a first electrode connected to the corresponding one of the output terminals of said predecode circuit, a second electrode connected to a corresponding one of said word lines, and a gate connected to the first terminal of said boosting capacitor; and a second group of transistors corresponding to the first group of transistors, each having a first electrode connected to the corresponding one of said word lines, a second electrode connected to a reference potential, and a gate connected to the second output terminal of said logic circuit.

* * * * *